United States Patent
Sakiyama et al.

(10) Patent No.: US 6,646,342 B2
(45) Date of Patent: Nov. 11, 2003

(54) SEMICONDUCTOR CHIP AND MULTI-CHIP MODULE

(75) Inventors: Shiro Sakiyama, Kyoto (JP); Jun Kajiwara, Kyoto (JP); Masayoshi Kinoshita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/097,140

(22) Filed: Mar. 14, 2002

(65) Prior Publication Data

US 2002/0149034 A1 Oct. 17, 2002

(30) Foreign Application Priority Data

Mar. 14, 2001 (JP) ......................................... 2001-072292

(51) Int. Cl.[7] .............................................. H01L 23/34
(52) U.S. Cl. ........................ 257/723; 257/678; 257/724; 257/777
(58) Field of Search ................................ 257/678, 723, 257/724, 777; 365/63, 72

(56) References Cited

U.S. PATENT DOCUMENTS

| 5,149,662 | A |   | 9/1992  | Eichelberger |        |
|-----------|---|---|---------|--------------|--------|
| 5,198,963 | A |   | 3/1993  | Gupta et al. |        |
| 5,504,354 | A |   | 4/1996  | Mohsen       |        |
| 5,703,747 | A |   | 12/1997 | Voldman et al. |      |
| 5,808,877 | A | * | 9/1998  | Jeong et al. | 361/813 |
| 5,918,107 | A |   | 6/1999  | Fogal et al. |        |
| 5,973,340 | A |   | 10/1999 | Mohsen       |        |
| 6,078,514 | A | * | 6/2000  | Takemae et al. | 365/63 |
| 6,205,082 | B1 | * | 3/2001 | Tomita et al. | 365/233 |
| 6,448,636 | B2 | * | 9/2002 | Suenaga et al. | 257/678 |

FOREIGN PATENT DOCUMENTS

| JP | 58092230   | 11/1981 |
| JP | 2000-258494 | 9/2000 |

* cited by examiner

Primary Examiner—Hoai Ho
Assistant Examiner—Dao H. Nguyen
(74) Attorney, Agent, or Firm—McDermott, Will & Emery

(57) ABSTRACT

A bare-chip IP of a multi-chip module and an external device of the multi-chip module are interfaced with each other through a dedicated I/O bare-chip IP. Each of the bare-chip IPs other than the dedicated I/O bare-chip IP is not provided with an interface circuit for connection to the external device, and thus is only required to have a withstand voltage characteristic corresponding to the operating voltage of an internal circuit. As a result, it is only necessary to provide, on the bare-chip IPs, transistors of a few kinds of withstand voltage characteristics.

10 Claims, 10 Drawing Sheets

SEMICONDUCTOR CHIP AND MULTI-CHIP MODULE

BACKGROUND OF THE INVENTION

The present invention relates to a multi-chip module including a plurality of semiconductor chips, and to a configuration of a semiconductor chip incorporated in a multi-chip.

In recent years, a concept of one-chip system LSI has been proposed in which a plurality of functions are incorporated in a single chip, and various proposals have been made as to design methods for one-ship system LSIs. Particularly, an advantage of a one-chip system LSI is in that a high-performance and multi-function device can be realized by integrating, in a single semiconductor chip, various functions including memories such as DRAMs and SRAMs, logic circuits, and analog circuits. However, the realization of such a system LSI, i.e., the manufacture of a device incorporating a plurality of functions therein has confronted the following problems.

The first problem is that a greater development power is required to increase the scale of a system LSI, and an increase in the chip area decreases the manufacturing yield, thereby increasing the device manufacturing cost.

The second problem is that a process for mixing different types of devices such as a DRAM and a FLASH is difficult to adjust to match a pure CMOS process, whereby when developing a process for a device for realizing a function, it is very difficult to start up the development at the same time with a pure CMOS process. Therefore, the development of the process for mixing different types of devices is delayed by one or two years from that of a state-of-the-art pure CMOS process, thereby failing to make a timely manufacture/supply to meet the needs of the market.

With regard to these problems, a chip-on-chip type system LSI has been proposed which is obtained by making a plurality of chips into a module, as disclosed in Japanese Laid-Open Patent Publication No. 58-92230. The chip-on-chip type multi-chip module technique is a technique of connecting, via bumps, pad electrodes provided on the upper surface of a chip to be a substrate (a parent chip) with pad electrodes provided on the upper surface of a chip to be mounted (a child chip), and attaching the chips to each other for electrical connection between the chips, thereby making the plurality of chips into a module. With the chip-on-chip type multi-chip module technique, as compared with a one-chip system LSI, a plurality of functions are incorporated in a plurality of chips in a dispersed manner, whereby it is possible to reduce the scale of each chip and to improve the yield of each chip. Furthermore, different types of devices of different process generations can be easily made into a module, whereby it is easy to increase the functionality. Moreover, in a system LSI using the chip-on-chip type multi-chip module technique, as compared with other multi-module techniques, the wire length required for the interface between the parent and child chips is very small, whereby it is possible to realize a high-speed interface, and to realize a performance as that of a block-to-block interface in a conventional one-chip system LSI.

As described above, the chip-on-chip type multi-chip module technique is an important technique replacing the conventional one-chip system LSI, but has the following problems.

Typically, in a bare-chip IP using a minute process, the operating voltage of an internal circuit is different from the voltage of an interface circuit between the bare-chip IP and an external device. Therefore, in order to form a multi-chip module, there is required a process for forming a plurality of types of transistors whose gate insulating films have different thicknesses.

Moreover, in a case where a plurality of bare-chip IPs are made into a multi-chip module, and where an interface with an external device outside the multi-chip module is required for each bare-chip IP, it is necessary to provide, for each bare-chip IP, at least two different transistors having different withstand voltages, i.e., one having a withstand voltage for an interface circuit and the other having a withstand voltage for an internal circuit. Thus, when manufacturing each bare-chip IP, there is required a process for forming transistors having a plurality of types of gate insulating films of different thicknesses.

As a result, it is not possible to avoid an increase in the process cost.

Moreover, in a case where the bare-chip IPs are used for general purposes, it is necessary to take into consideration that an input/output terminal of each bare-chip IP is to be connected to an external device outside the multi-chip module, whereby it is necessary to provide a surge protection function in all input/output circuits of each bare-chip IP.

SUMMARY OF THE INVENTION

An object of the present invention is to provide a configuration of a multi-chip module that can be manufactured at a low cost and a semiconductor chip suitable therefor, by simplifying a process for manufacturing a semiconductor chip to be a bare-chip IP to be incorporated in a multi-chip module.

A semiconductor chip of the present invention is an I/O semiconductor chip provided in a multi-chip module that includes a plurality of semiconductor chips and a plurality of external terminals, the I/O semiconductor chip including an input/output function section including a plurality of input/output circuits that are provided between the plurality of semiconductor chips and the plurality of external terminals.

In this way, all the interfacing between the semiconductor chips in the multi-chip module and the external devices outside the multi-chip module is provided through the input/output function section of the I/O semiconductor chip. Therefore, when configuring the multi-chip module, it is not necessary to provide a transistor that operates with a voltage for the interface circuit, in the semiconductor chips other than the I/O semiconductor chip. As a result, when manufacturing the semiconductor chips, it is possible to reduce the number of types of transistors, e.g., it is possible to form only one type of transistors having the same thickness, whereby the manufacturing process is simplified and the manufacturing cost can be reduced.

Moreover, since the semiconductor chips other than the I/O semiconductor chip have no interface with external devices, it is possible to eliminate the need for a surge protection member in each semiconductor chip or to reduce the function of the surge protection member. Thus, it is possible to reduce the area of each semiconductor chip.

On the other hand, the capacitance incurred by the surge protection circuit that is necessary for the interface between the semiconductor chips in the multi-chip module is very small as compared with that in the prior art. Therefore, it is possible to increase the speed of the interface in the multi-chip module, and to reduce the power consumption of the multi-chip module.

Moreover, even when there are various interfaces with various specifications between the semiconductor chips in the multi-chip module and the external devices outside the multi-chip module, it can be addressed flexibly by appropriately setting the function of the I/O semiconductor chip without changing the functions of the other semiconductor chips.

Even changes of the I/O specifications can be addressed flexibly by appropriately setting the configuration of the input/output section of the I/O semiconductor chip without changing the functions of the other semiconductor chips.

It is preferred that: the plurality of external terminals include a power supply terminal and a ground terminal; and the input/output function section includes a power supply section connected to the power supply terminal for supplying a power supply voltage to the plurality of semiconductor chips, and a ground voltage supply section connected to the power supply terminal for supplying a ground voltage to the plurality of semiconductor chips.

If a surge protection member provided between the ground terminal among the plurality of external terminals and one or more of the plurality of external terminals excluding the ground terminal is further included, it is possible to, when configuring the multi-chip module, eliminate the need for a surge protection member in each semiconductor chip other than the I/O semiconductor chip or to reduce the function of the surge protection member.

It is preferred that the plurality of input/output circuits of the input/output function section are configured so as to be able to individually select a power supply voltage.

At least one of the plurality of input/output circuits of the input/output function section may be configured so as to be switchable between an input function of receiving a signal from the semiconductor chip that is connected to the input/output circuit and an output function of outputting a signal to the external terminal to which the input/output circuit is connected.

If the input/output circuits receive a plurality of power supply voltages and include a level shift circuit for converting a voltage level from a level of a first voltage among the plurality of power supply voltages to a level of a second voltage, it is possible to ensure an input/output function even when the operating voltage of the internal circuit of the semiconductor chip is different from that of the external device.

In this case, it is preferred that the first voltage and the second voltage are configured so that a voltage value can be selected for each of the input/output circuits in the input/output function section.

A first multi-chip module of the present invention includes a plurality of semiconductor chips and a plurality of external terminals, the multi-chip module including an I/O semiconductor chip that includes an input/output function section including a plurality of input/output circuits provided between the plurality of semiconductor chips and the plurality of external terminals.

In this way, it is possible to realize the basic effects of the semiconductor chips in a multi-chip module.

A second multi-chip module of the present invention includes a group of small chips mounted on a large chip that includes a plurality of external terminals, the multi-chip module including an I/O semiconductor chip that includes an input/output function section including a plurality of input/output circuits provided between the plurality of external terminals on the large chip and individual ones of the group of small chips.

It is preferred that the large chip is a substrate dedicated for wiring that does not include a semiconductor element.

In this way, the manufacturing process for a semiconductor chip to be a substrate on which small chips are mounted can be simplified, whereby the manufacturing cost can be reduced and the developing time can be reduced. Furthermore, by employing a dedicated wiring substrate, it is possible to avoid disadvantages due to miniaturization of wiring, such as deterioration of the power supply impedance and an increase in the wiring delay. Moreover, since the semiconductor chip to be a substrate does not have a semiconductor element such as a transistor, a yield of substantially 100% can be expected, and the pre-shipping test of the substrate chip can be simplified in some cases, thereby further reducing the cost. Moreover, since there are no semiconductor elements on the semiconductor chip to be a substrate, the semiconductor chip can be designed so as to ensure only an area that is required for making the module, thereby considerably increasing the freedom in the selection and design of the small chips to be mounted thereon. Moreover, since the semiconductor chip is a dedicated wiring substrate, a minute pattern is not needed, whereby the existing semiconductor processes of old generations can be reused, and it is possible to provide a substrate chip at a lower cost.

DESCRIPTION OF THE PREFERRED EMBODIMENTS

Basic Configuration on Which the Embodiments are Based

A most preferred embodiment of a chip-on-chip type multi-chip module of the present invention is a configuration in which a silicon wiring substrate (Super-Sub) that is dedicated for wiring formation is used as a substrate chip, and a plurality of chips (mounted chips) having various functions are mounted on the silicon wiring substrate. Herein, the mounted chips can be treated as IPs (Intellectual Properties) in terms of the design for each of the chip functions, and thus can be called "bare-chip IPs", which are attached onto the Super-Sub. Moreover, the silicon wiring substrate does not include semiconductor elements such as transistors, but includes wires and pad electrodes.

Therefore, the semiconductor device as a whole is an "IP On Super-Sub", and thus the multi-chip module as a whole including the silicon wiring substrate and the group of various bare-chip IPs will be referred to as an "IPOS device" in the embodiments set forth herein.

First Embodiment

Figure 1:
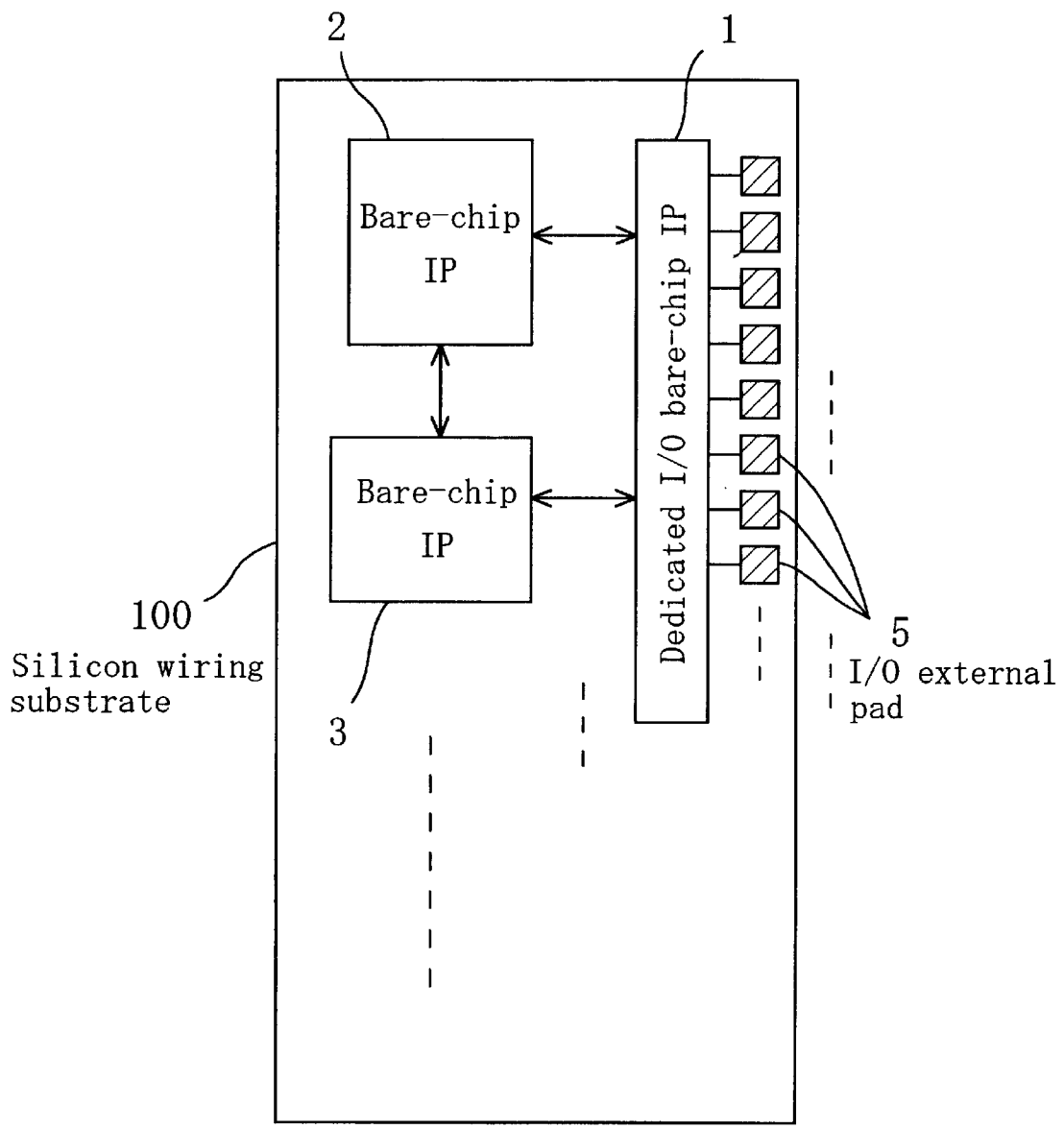
FIG. 1 is a plan view illustrating an IPOS device according to an embodiment of the present invention.

FIG. 1 is a plan view illustrating an IPOS device of various embodiments of the present invention. As illustrated in the figure, the IPOS device of the present embodiment is made into a module by connecting a plurality of bare-chip IPs 2, 3, . . . , to a silicon wiring substrate 100 for electrical connection between the bare-chip IPs 2, 3, . . . , and thus is a multi-chip module.

Herein, a feature of the IPOS device of the present embodiment is the provision of a dedicated I/O bare-chip IP 1 that functions as an interface between a plurality of bare-chip IPs 2, 3, . . . , and external devices. The dedicated I/O bare-chip IP 1 is connected to an I/O external pad 5, which is an external terminal on the silicon wiring substrate 100, through the wiring layers in the silicon wiring substrate 100, and members (bonding wires, bumps, etc.) for electrical connection with the external devices are connected to the I/O external pad 5.

All the interfacing between the bare-chip IPs and the external devices outside the IPOS device is provided through an input/output function section of the dedicated I/O bare-chip IP. Therefore, when configuring the IPOS device (multi-chip module), it is not necessary to provide a transistor that operates with a voltage for the interface circuit, in the bare-chip IPs other than the dedicated I/O bare-chip IP. As a result, when manufacturing the bare-chip IPs, it is only necessary to form fewer types of transistors than in the prior art, whereby the manufacturing process is simplified and the manufacturing cost can be reduced.

Moreover, since the semiconductor chips other than the dedicated I/O bare-chip IP have no interface with external devices, as will be described later, it is possible to eliminate the need for a surge protection member in each bare-chip IP or to reduce the function of the surge protection member. Thus, it is possible to reduce the area, i.e., the size, of each bare-chip IP.

Moreover, even when there are various interfaces with various specifications between the bare-chip IPs in the IPOS device and the external devices outside the IPOS device, it can be addressed flexibly by appropriately setting the function of the dedicated I/O bare-chip IP without changing the functions of the other bare-chip IPs.

Note that the multi-chip module itself of the present invention does not need to include a large chip dedicated for wiring, which does not necessarily include semiconductor elements. However, if a large chip to be a substrate on which bare-chip IPs, which are small chips, are mounted, is a dedicated wiring substrate (the silicon wiring substrate 100 in the present embodiment), the manufacturing process for a large chip on which bare-chip IPs, which are small chips, are mounted can be simplified, whereby the manufacturing cost can be reduced and the developing time can be reduced. Furthermore, by employing a dedicated wiring substrate, it is possible to avoid disadvantages due to miniaturization of wiring, such as deterioration of the power supply impedance and an increase in the wiring delay. Moreover, since the silicon wiring substrate 100, being a large chip to be a substrate, does not have a semiconductor element such as a transistor, a yield of substantially 100% can be expected, and the pre-shipping test of the silicon wiring substrate 100 can be simplified in some cases, thereby further reducing the cost. Moreover, since there are no semiconductor elements on the silicon wiring substrate 100, the silicon wiring substrate 100 can be designed so as to ensure only an area that is required for making the module, thereby considerably increasing the freedom in the selection and design of bare-chip IPs (small chips) to be mounted thereon. Moreover, since the silicon wiring substrate 100 is a dedicated wiring substrate, a minute pattern is not needed, whereby the existing semiconductor processes of old generations can be reused, and it is possible to provide a substrate chip at a lower cost.

Figure 2:
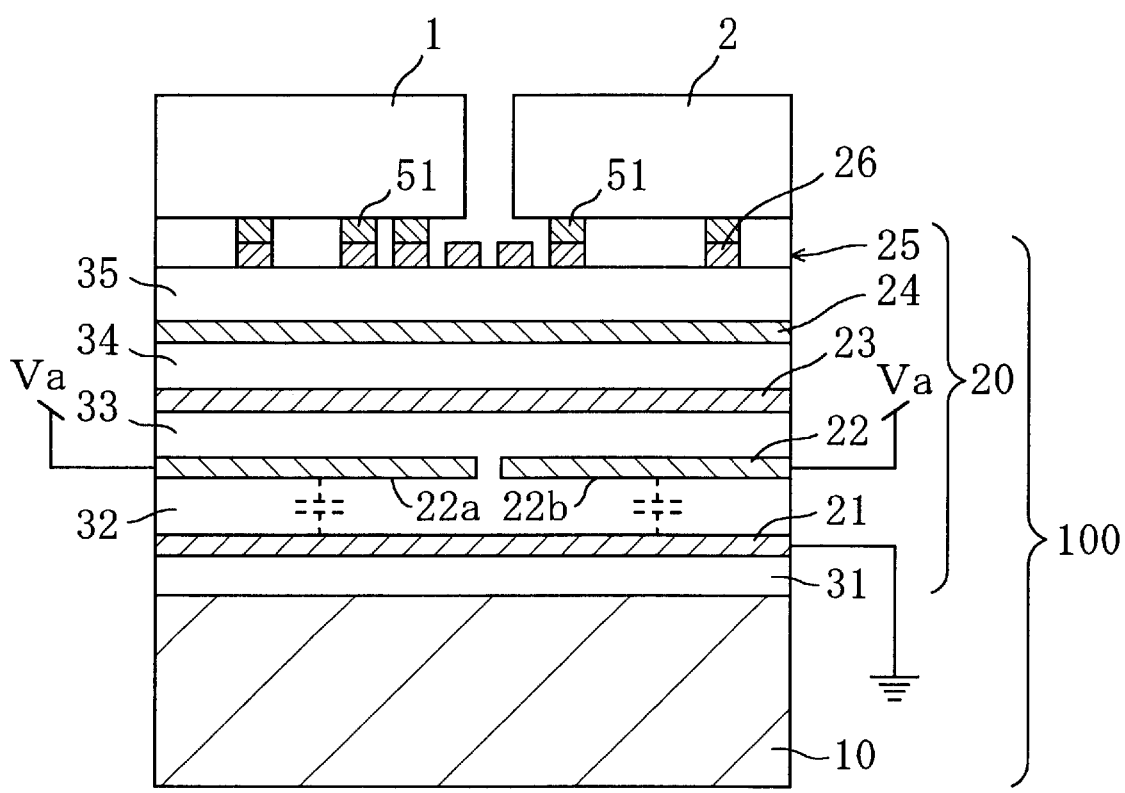
FIG. 2 is a cross-sectional view illustrating a portion of the IPOS device illustrated in FIG. 1.

FIG. 2 is a cross-sectional view illustrating a portion of the IPOS device illustrated in FIG. 1. FIG. 2 shows a portion where the I/O bare-chip IP 1 and the bare-chip IP 2 are mounted on the silicon wiring substrate 100.

As illustrated in the figure, the silicon wiring substrate 100 includes a p-type silicon substrate 10 and a multi-layer wiring layer 20 provided on the silicon substrate 10. The multi-layer wiring layer 20 includes a first insulative film 31 provided on the silicon substrate 10, a ground plane layer 21 provided on the first insulative film 31, a second insulative film 32 provided on the ground plane layer 21, a power supply plane layer 22 provided on the second insulative film 32, a third insulative film 33 provided on the power supply plane layer 22, a first wiring layer 23 provided on the third insulative film 33, a fourth insulative film 34 provided on the first wiring layer 23, a second wiring layer 24 provided on the fourth insulative film 34, a fifth insulative film 35 provided on the second wiring layer 24, and a pad electrode layer 25 provided on the fifth insulative film 35 and including a number of pads 26 arranged in an array. Semiconductor elements such as transistors are not formed on the silicon wiring substrate 100. Note however that the wiring layers 21 to 24, the pads 26, and contacts for connecting the wires and the pad electrodes to each other, are formed.

The pads 26 in the pad electrode layer 25 of the silicon wiring substrate 100 and pads 51 of the dedicated I/O bare-chip IP 1 or the bare-chip IP 2 are attached to each other via bumps, etc. The signal connection between the bare-chip IPs 2, 3, . . . , is provided in a similar manner. With such a configuration, semiconductor elements such as transistors in the bare-chip IPs 2, 3, . . . , are connected to external devices via the multi-layer wiring layer 20 and the dedicated I/O bare-chip IP 1. Moreover, semiconductor elements such as transistors in the bare-chip IPs 2, 3, . . . , are electrically connected to one another through the multi-layer wiring layer 20.

Note that instead of the silicon substrate 10 illustrated in FIG. 2, other types of semiconductor substrates, such as a glass substrate or a metal substrate, may alternatively be used. However, a silicon substrate is advantageous in that the existing conventional semiconductor processes can be used as they are, and it has the same thermal expansion coefficient as that of a bare-chip IP formed by using a silicon substrate, whereby a multi-chip module having a high reliability with little deformation can be obtained.

Herein, the ground plane layer 21 and the power supply plane layer 22 illustrated in FIG. 2 are made of an Al (aluminum) alloy film having a thickness on the order of $\mu$m. Note however that the ground plane layer 21 and/or the power supply plane layer 22 may alternatively be made of a Cu (copper) film, a W (tungsten) film, a Ti (titanium) film, or the like.

Moreover, while FIG. 2 illustrates a configuration where two wiring layers, i.e., the first wiring layer 23 and the second wiring layer 24, are provided in addition to the ground plane layer 21 and the power supply plane layer 22, a greater number of wiring layers, or only one wiring layer, may alternatively be provided. Although FIG. 2 illustrates the first wiring layer 23 and the second wiring layer 24 each as a continuous film, wires that are patterned generally in a linear shape are actually formed in the wiring layers 23 and 24. Since wires provided in the wiring layers 23 and 24 include those between pad electrodes arranged at a pitch of about 50 $\mu$m and those for an I/O function to/from the outside of the multi-chip module, the dimensional limitation on the wiring layers 23 and 24 is loose, and it is only necessary to perform the patterning process by a wiring rule of a pitch on the order of $\mu$m to 10 $\mu$m. This loose patterning rule means not only that semiconductor processes of older generations can be reused, but also that it is possible to provide a silicon wiring substrate with a low wiring impedance and with a good yield.

Note that although not shown in FIG. 2, contacts are provided running through the insulative films 33, 34 and 35 for electrically connecting the wiring layers 23 and 24 to each other, or for electrically connecting the wiring layers 23 and 24 to the pad electrode layer 25, as will be described later.

Method of Attachment

Figure 3:
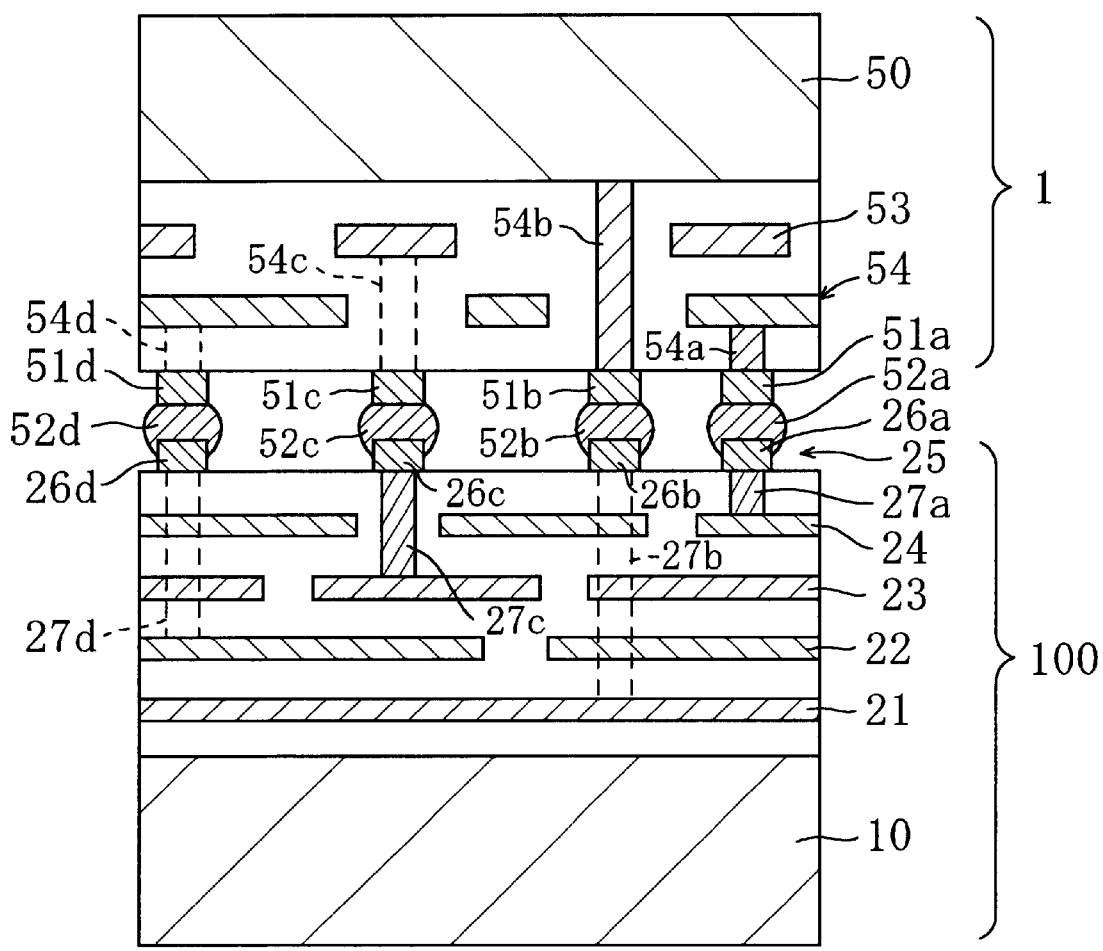
FIG. 3 is a cross-sectional view illustrating an example of a configuration of a junction between pad electrodes of a silicon wiring substrate and pad electrodes of a bare-chip IP according to an embodiment of the present invention.

FIG. 3 is a cross-sectional view illustrating an example of a configuration of a junction between pad electrodes of a silicon wiring substrate and pad electrodes of a bare-chip IP. Although FIG. 3 only illustrates the connection between the dedicated I/O bare-chip IP 1 and the silicon wiring substrate 100, the connection between the other bare-chip IPs 2, 3, . . . , and the silicon wiring substrate 100 is basically the same as that illustrated in FIG. 3. As illustrated in the figure, the pads 26 of the silicon wiring substrate 100 and the pads 51 provided on the primary surface of the bare-chip IP 1 are attached to each other via bumps 52. Moreover, the bare-chip IP 1 includes a semiconductor substrate 50 having a semiconductor element such as a transistor (not shown) provided thereon, and first and second wiring layers 53 and 54 provided on the semiconductor substrate 50, and the semiconductor element and the wiring layers 53 and 54 together form an internal circuit. As illustrated in the figure, there are various patterns of connection between the silicon wiring substrate 100 and the bare-chip IP 1, such as that between the pad electrodes, that between the pad electrodes and the wires, and that between the pad electrodes and the internal circuit.

In the silicon wiring substrate 100, a pad 26a and a wire in the second wiring layer 24 are connected to each other via a plug (contact) 27a. On the other hand, in the dedicated I/O bare-chip IP 1, a pad 51a is connected to the pad 26a of the silicon wiring substrate 100 via a bump 52a, and a plug 54a for connecting the pad 51a and the second wiring layer 54 to each other is provided in the dedicated I/O bare-chip IP 1.

In the silicon wiring substrate 100, a pad 26b is connected to the ground plane layer 21 in a cross section other than that shown in FIG. 3. On the other hand, in the bare-chip IP 1, a pad 51b is connected to the pad 26b of the silicon wiring substrate 100 via a bump 52b, and a plug 54b for connecting the pad 51b and the semiconductor substrate 50 to each other is further provided.

In the silicon wiring substrate 100, a pad 26c is connected to the first wiring layer 23 via a plug 27c. On the other hand, in the bare-chip IP 1, a pad 51c is connected to the pad 26c of the silicon wiring substrate 100 via a bump 52c, and a plug 54c for connecting the pad 51c and the first wiring layer 53 of the bare-chip IP 1 to each other is provided.

In the silicon wiring substrate 100, a pad 26d is connected to the power supply plane layer 22 via a plug 27d. On the other hand, in the bare-chip IP 1, a pad 51d is connected to the pad 26d of the silicon wiring substrate 100 via a bump 52d, and a plug 54d for connecting the pad 51d and the second wiring layer 54 of the bare-chip IP 1 to each other is provided.

As described above, the pad electrodes are electrically connected to one another via bumps, the pad electrodes and the wiring layers are electrically connected to each other via plugs, and the wiring layers on the silicon wiring substrate 100 are connected to the internal circuit of the dedicated I/O bare-chip IP 1. Note however that the pads 51 of the dedicated I/O bare-chip IP 1 may include dummy pad electrodes for ensuring a sufficient mechanical strength that are not electrically connected to the internal circuit in the dedicated I/O bare-chip IP 1. Moreover, similarly to the pads 51 of the dedicated I/O bare-chip IP 1, the pads 26 in the silicon wiring substrate 100 may also include dummy pad electrodes for ensuring a sufficient mechanical strength that are not connected to wires in the substrate.

Detailed Configuration of Dedicated I/O Bare-Chip IP

Figure 4:
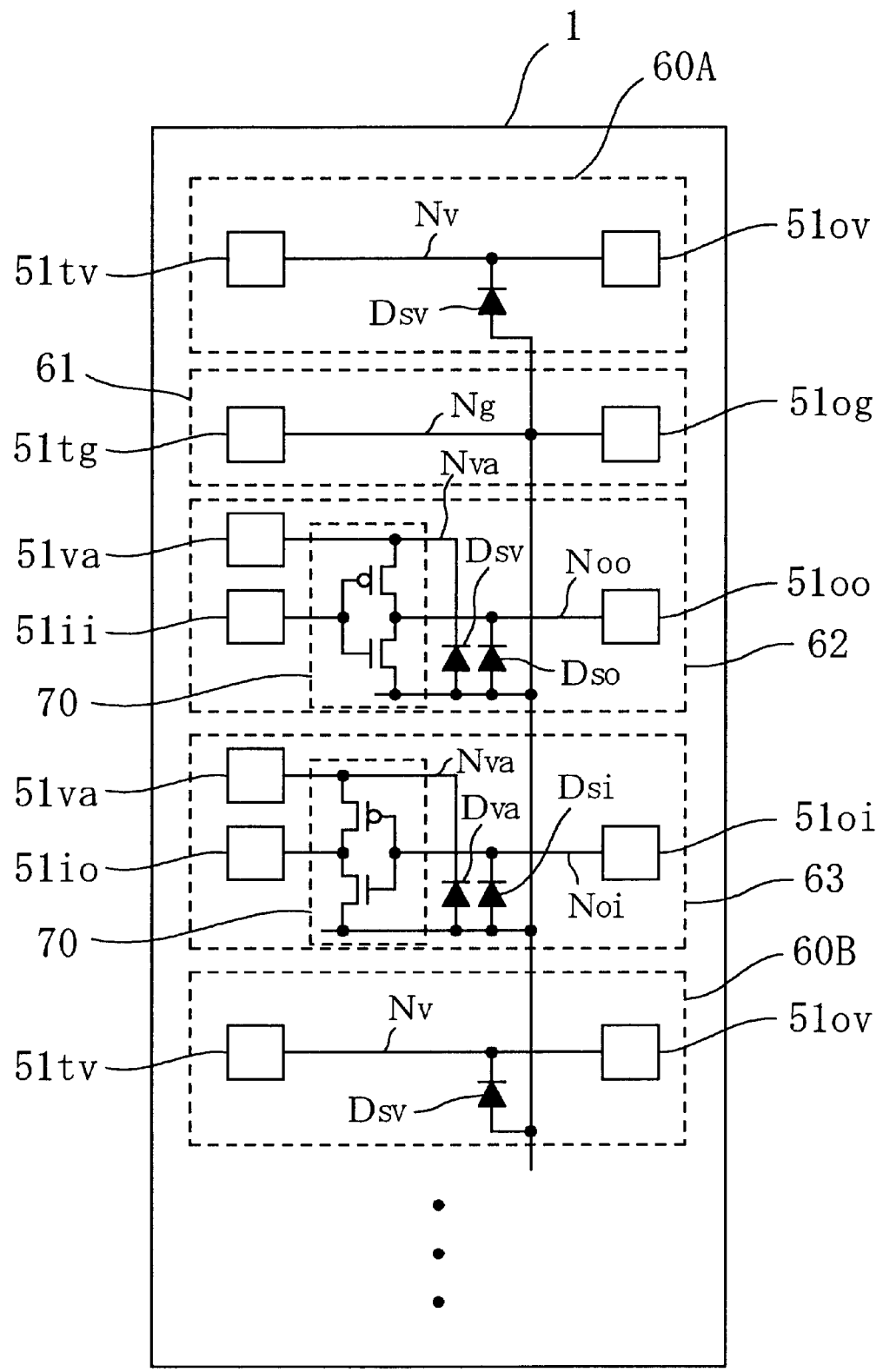
FIG. 4 is a block circuit diagram schematically illustrating a configuration of a dedicated I/O bare-chip IP according to the first embodiment of the present invention.

FIG. 4 is a block circuit diagram schematically illustrating a configuration of the dedicated I/O bare-chip IP 1 according to the first embodiment of the present invention. As illustrated in the figure, the dedicated I/O bare-chip IP 1 includes, as examples of primary components, a first power supply input section 60A, a ground input section 61, an output buffer section 62, an input buffer section 63, and a second power supply input section 60B. Note however that these are merely examples, and a large number of other power supply input sections, output buffer sections, input buffer sections, etc., are provided in the dedicated I/O bare-chip IP 1, in addition to those illustrated in FIG. 4. A large number of output buffer sections and/or input buffer sections are provided for one bare-chip IP in many cases, and a plurality of power supply input sections may possibly be provided for one bare-chip IP in some cases. Note however that it is preferred that also a plurality of ground input sections are provided so as to lower the ground impedance.

The power supply input sections 60A and 60B each include a chip power supply pad 51*tv* for supplying a power supply voltage to each bare-chip IP, and an external power supply input pad 51*ov* for receiving the supply of a power supply voltage from an external power supply. Moreover, the ground input section 61 includes a chip ground pad 51*tg* for supplying a ground power supply to each bare-chip IP, and an external ground input pad 51*og* for receiving the supply of a ground power supply from the outside.

The output buffer section 62 includes an I/O external output pad 51*oo* for outputting a signal to an I/O external pad, an I/O circuit section 70, an I/O power supply pad 51*va* for supplying a power supply voltage Vdd to the I/O circuit section 70, and an I/O internal input pad 51*ii* for receiving a signal from the bare-chip IP to the I/O circuit section 70.

The input buffer section 63 includes an I/O external input pad 51*oi* for receiving a signal from an I/O external pad, the I/O circuit section 70, the I/O power supply pad 51*va* for supplying a power supply voltage Vdd to the I/O circuit section 70, and an I/O internal output pad 51*io* for supplying a signal from the I/O circuit section 70 to the bare-chip IP.

Herein, a feature of the IPOS device (multi-chip module) according to the present embodiment is the provision of surge protection diodes as described below.

First, a surge protection diode Dsv is provided between a ground node Ng connected to a ground line and a power supply node Nv connected to a power supply line. Thus, when a surge signal is input from the power supply line, the surge protection diode Dsv breaks down, thereby bypassing the surge signal to the ground line.

Moreover, in the output buffer section 62, surge protection diodes Dso and Dsv are provided respectively between an external output node Noo connected to the external output pad 51*oo*, which is connected to the I/O external pad, and the ground node Ng, and between a power supply node Nva connected to the I/O power supply pad 51*va* and the ground node Ng. The external output node Noo is connected to the I/O external pad 5 (see FIG. 1) through the external output pad 51*oo*, and the I/O power supply pad 51*va* is connected to the I/O external pad 5 for power supply via a wiring layer in the silicon wiring substrate, whereby a surge from an external I/O pad may possibly be input directly to the external output node Noo and the power supply node Nva. In view of this, the external output node Noo and the power supply node Nva are connected to the ground node Ng via the surge protection diodes therebetween, so as to prevent the surge input from damaging the I/O circuit 70 of the dedicated I/O bare-chip IP 1.

Furthermore, in the input buffer section 63, surge protection diodes Dsi and Dva are provided respectively between an external input node Noi connected to the I/O external input pad 51*oi*, which is connected to an I/O external pad, and the ground node Ng, and between the power supply node Nva connected to the I/O power supply pad 51*va* and the ground node Ng. The external input node Noi is connected to the I/O external pad 5 (see FIG. 1) through the external input pad 51*oi*, and the I/O power supply pad 51*va* is connected to the I/O external pad 5 for power supply via a wiring layer in the silicon wiring substrate, whereby a surge from an I/O external pad, etc., may possibly be input directly to the external output node Noo and the power supply node Nva. In view of this, the external input node Noi and the power supply node Nva are connected to the ground node Ng via the surge protection diodes therebetween, so as to prevent the surge input from damaging the VO circuit 70 of the dedicated I/O bare-chip IP 1.

Thus, in the dedicated I/O bare-chip IP 1, a surge protection diode is always provided between a node that exchanges signals with an I/O external pad and the ground node, whereby it is no longer necessary to provide a surge protection function separately for each bare-chip IP, and it is possible to reduce the area of each bare-chip IP, to increase the speed of the interface in the IPOS device (multi-chip module), and to reduce the power consumption of the IPOS device as a whole.

Note however that in the dedicated I/O bare-chip IP 1, it is not necessary to provide a surge protection diode between each node that is connected to an I/O external pad and the ground node. For example, even if a surge protection diode is provided only for a node that connects an I/O circuit section and an I/O external pad to each other, or only for a node that is connected to an I/O external pad for external power supply, the surge protection effect can be exerted to a certain degree.

Example of Configuration of I/O Circuit Section

The I/O circuit section 70 illustrated in FIG. 4 may employ any of various circuit configurations other than that illustrated in FIG. 4. Those examples will now be described.

Figure 5:
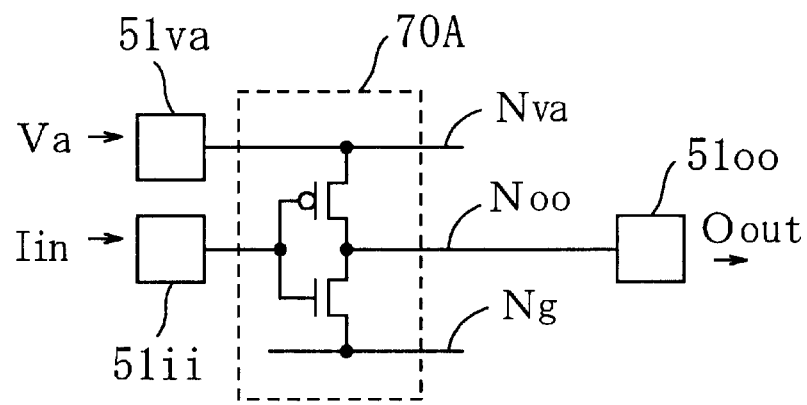
FIG. 5 is an electric circuit diagram schematically illustrating a configuration of an I/O circuit section having the simplest buffer function shown in the output buffer circuit in FIG. 4.

FIG. 5 is an electric circuit diagram schematically illustrating a configuration of an I/O circuit section 70A having the simplest buffer function shown in the output buffer section 62 in FIG. 4. As illustrated in the figure, an inverter is provided between the power supply node Nva to which a power supply voltage Va is supplied and the ground node Ng. An internal input signal Iin from the bare-chip IP is input from the internal input pad 51*ii* to the inverter, and an external output signal Oout is output from the output section of the inverter to an I/O external pad via the external output node Noo and the I/O external output pad 51*oo*. Note that as in the example illustrated in FIG. 4, surge protection diodes are provided between the external output node Noo connected to the I/O external output pad 51*oo* and the ground node Ng, and between the power supply node Nva connected to the I/O power supply pad 51*va* and the ground node Ng.

Figure 6:
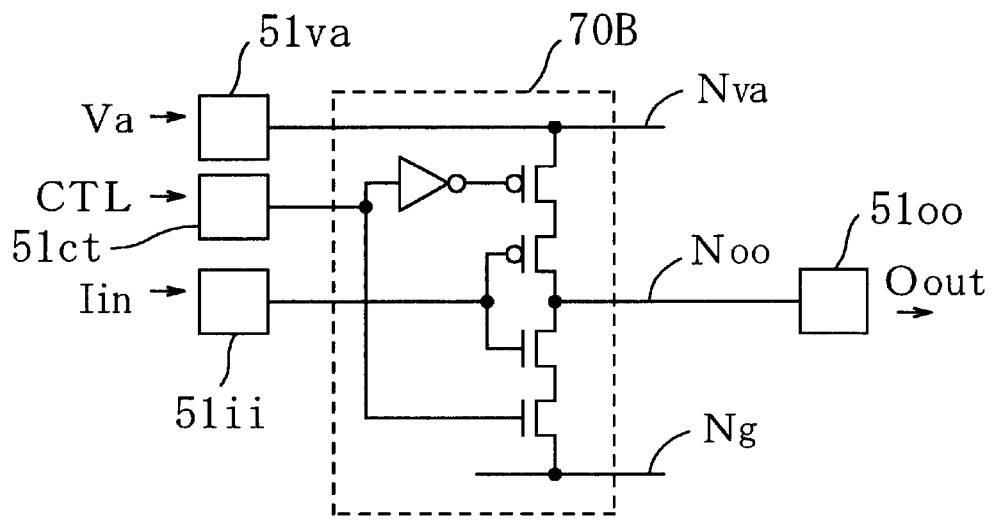
FIG. 6 is an electric circuit diagram illustrating a configuration of an I/O circuit section that functions as an output circuit with a Hi-Z function.

FIG. 6 is an electric circuit diagram illustrating a configuration of an I/O circuit section 70B functioning as an output circuit with a Hi-Z function. As illustrated in the figure, in the I/O circuit section 70B, a PMOSFET is provided between the inverter and the power supply node Nva, and an NMOSFET is provided between the inverter and the ground node Ng. Moreover, a control signal pad 51*ct* for receiving a control signal CTL is provided outside the I/O circuit section 70B, and the signal from the control signal pad 51*ct* is input to the gate electrode of the NMOSFET directly, and to the gate electrode of the PMOSFET via the inverter. The control signal CTL is at a logical value "H" when in a mode in which the inverted signal of the internal input signal Iin is output as it is, and at a logical value "L" when in a mode in which Hi-Z (high impedance) is output. Thus, the I/O circuit section 70B operates as the I/O circuit section 70A illustrated in FIG. 5 when the control signal CTL is at "H", but the potential of the external output node Noo is at a high impedance when the control signal CTL is at the logical value "L" since the inverter is then cut off from the power supply node Nva and the ground node Ng. Note that as in the example illustrated in FIG. 4, surge protection diodes are provided between the external output node Noo connected to the I/O external output pad 51*oo* and the ground node Ng, and between the power supply node Nva connected to the I/O power supply pad 51*va* and the ground node Ng.

Figure 7:
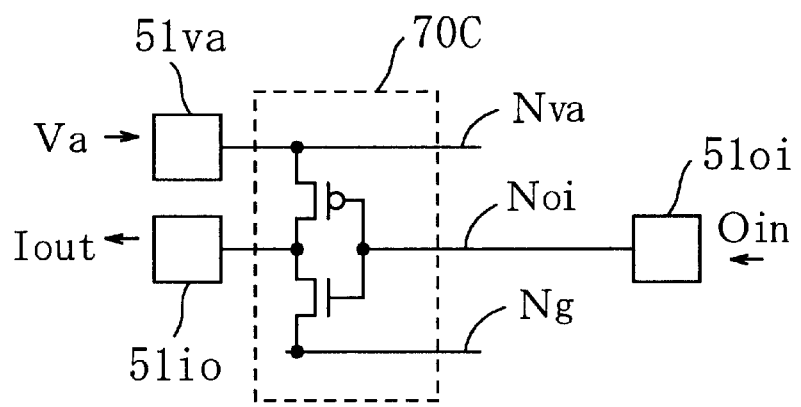
FIG. 7 is an electric circuit diagram schematically illustrating a configuration of an I/O circuit section having the simplest buffer function shown in the input buffer circuit in FIG. 4.

FIG. 7 is an electrical circuit diagram schematically illustrating a configuration of an I/O circuit section 70C having the simplest buffer function shown in the input buffer section 63 in FIG. 4. As illustrated in the figure, an inverter is provided between the power supply node Nva to which the power supply voltage Va is supplied and the ground node Ng. An external input signal Oin is input to the inverter from an I/O external pad via the external input pad 51*oi* and the external input node Noi, and an internal output signal Iout is sent from the output section of the inverter to the bare-chip IP via the internal output pad 51*io*. Note that as in the example illustrated in FIG. 4, surge protection diodes are provided between the external input node Noi connected to the I/O external input pad 51*oi* and the ground node Ng, and between the power supply node Nva connected to the I/O power supply pad 51*va* and the ground node Ng.

Figure 8:
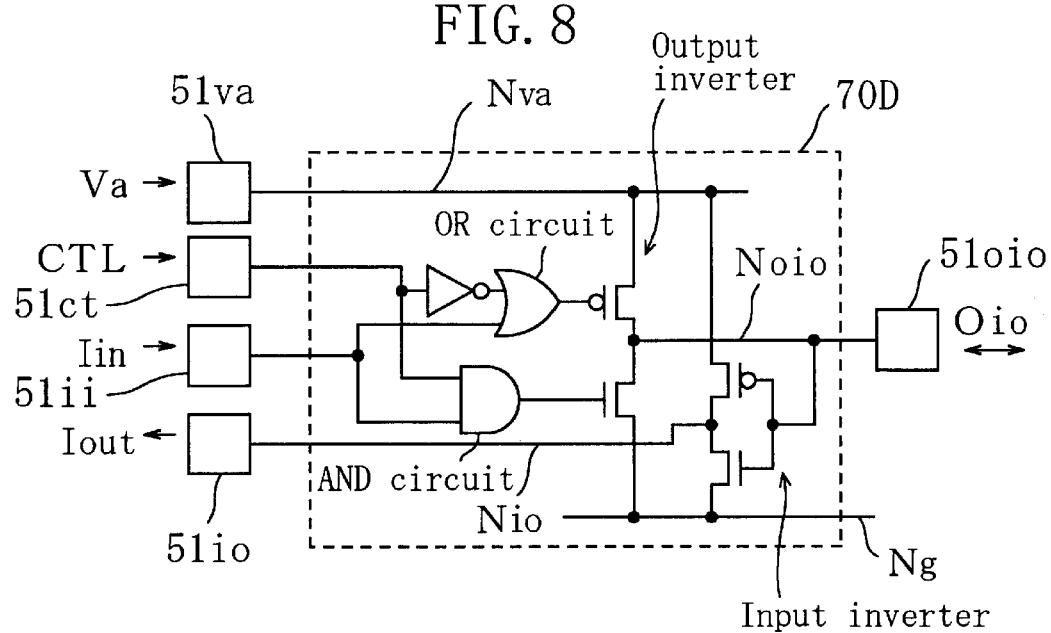
FIG. 8 is an electric circuit diagram illustrating a configuration of an I/O circuit section that functions as an input/output circuit, i.e., has a function of switching between input and output of an I/O function.

FIG. 8 is an electric circuit diagram illustrating a configuration of an I/O circuit section 70D that functions as an input/output circuit, i.e., has a function of switching between input and output of an I/O function. As illustrated in the figure, the I/O power supply pad 51*va* for supplying the power supply voltage Va to the I/O circuit section 70D, the control signal pad 51*ct* for receiving the control signal CTL, the I/O internal input pad 51*ii* for receiving a signal from the bare-chip IP to the I/O circuit section 70D, the I/O internal output pad 51*io* for supplying a signal from the I/O circuit section 70D to the bare-chip IP, and an I/O external input/output pad 51*oio* for outputting a signal to an I/O external pad and receiving a signal from the I/O external pad, are provided outside the I/O circuit section 70D.

Moreover, in the I/O circuit section 70D, an input inverter and an output inverter are provided between the power supply node Nva and the ground node Ng. Furthermore, an OR circuit for supplying a control signal to the gate electrode of a PMOSFET of the output inverter and an AND circuit for supplying a control signal to the gate of an NMOSFET of the output inverter are provided. A signal obtained by an OR operation between the inverted signal of the control signal CTL and the internal input signal Iin is input to the gate electrode of the PMOSFET of the output inverter, and a signal obtained by an AND operation between the control signal CTL and the internal input signal Iin is input to the gate electrode of the NMOSFET of the output inverter.

When the control signal CTL is at the logical value "H", the output inverter outputs the inverted signal of the internal input signal Iin, and the inverted signal is output, as an external input/output signal Ooio, from the I/O external input/output pad 51*oio* to an I/O external pad via an input/output node Noio. On the other hand, when the control signal CTL is at the logical value "L", the PMOSFET and the NMOSFET of the output inverter are always OFF whether the logical value of the internal input signal Iin is "H" or "L", whereby the output of the output inverter is in a Hi-Z (high impedance) state. Therefore, the inverted signal of the external input/output signal Ooio, which is input from the I/O external input/output pad 51*oio*, is sent from the I/O internal output pad 51*io* to the bare-chip IP as the internal output signal Iout.

Note that as in the example illustrated in FIG. 4, surge protection diodes are provided between the external input/output node Noio connected to the I/O external input/output pad 51*oio* and the ground node Ng, and between the power supply node Nva connected to the I/O power supply pad 51*va* and the ground node Ng.

Figure 9:
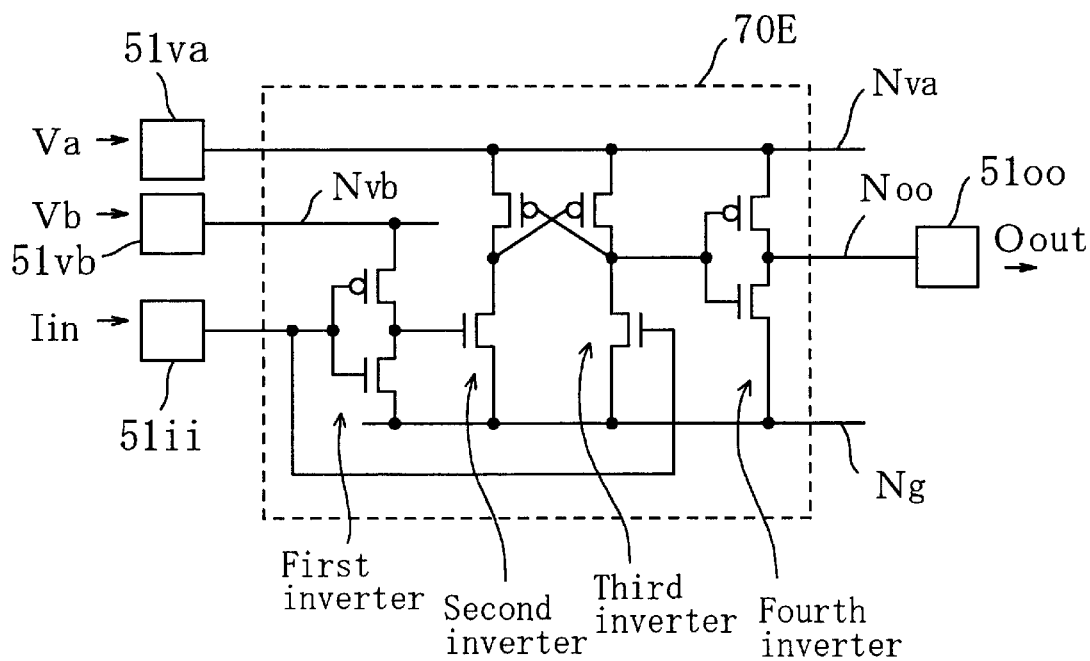
FIG. 9 is an electric circuit diagram illustrating a configuration of an I/O circuit section that functions as an output circuit with a level shift circuit.

FIG. 9 is an electric circuit diagram illustrating a configuration of an I/O circuit section 70E that functions as an output circuit with a level shift circuit. As illustrated in the figure, in the I/O circuit section 70E, a first inverter is provided between a low voltage side power supply node Nvb connected to an I/O power supply pad 51*vb* for supplying a low voltage power supply voltage Vb and the ground node. Moreover, second, third and fourth inverters are provided between the power supply node Nva connected to the I/O power supply pad 51*va* for supplying a high voltage power supply voltage Va and the ground node Ng. The output section of the second inverter is connected to the gate electrode of the PMOSFET of the third inverter, while the output section of the third inverter is connected to the gate electrode of the PMOSFET of the second inverter, and the non-inverted signal of the internal input signal Iin, which is input from the I/O internal input pad 51*ii*, is output from the I/O external output pad 51*oo* as the external output signal Oout, which is obtained by converting the voltage level from Vb to Va (Va>Vb). This is a configuration that is particularly significant when the voltage level of the external I/F is higher than the power supply voltage Vb of the bare-chip IP.

Note that as in the example illustrated in FIG. 4, surge protection diodes are provided between the external output node Noo connected to the I/O external output pad 51*oo* and the ground node Ng, and between the power supply node Nva connected to the I/O power supply pad 51*va* and the ground node Ng.

Figure 10:
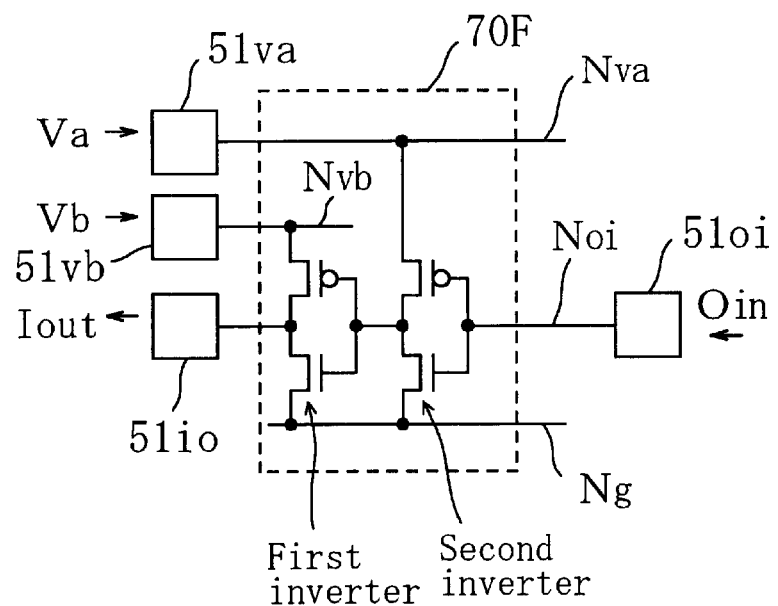
FIG. 10 is an electric circuit diagram illustrating a configuration of an I/O circuit section that functions as an input circuit with a level shift circuit.

FIG. 10 is an electric circuit diagram illustrating a configuration of an I/O circuit section 70F that functions as an input circuit with a level shift circuit. As illustrated in the figure, in the I/O circuit section 70F, a first inverter is provided between the low voltage side power supply node Nvb connected to the I/O power supply pad 51*vb* for supplying the low voltage power supply voltage Vb and the ground node. Moreover, a second inverter is provided between the power supply node Nva connected to the I/O power supply pad 51*va* for supplying the high voltage power supply voltage Va and the ground node Ng. The output section of the second inverter is connected to the gate electrodes of the PMOSFET and the NMOSFET of the first inverter, and is configured so as to output the non-inverted signal of the external input signal Oin, which is input from the I/O external input pad 51*oi* from the I/O internal output pad 51*io* as the internal output signal Iout, which is obtained by converting the voltage level from Va to Vb (Va>Vb). This is a configuration that is particularly significant when the device withstand voltage of the bare-chip IP is as low as about Vb, which is lower than the voltage level Va of the external I/F.

Note that as in the example illustrated in FIG. 4, surge protection diodes are provided between the external input node Noi connected to the I/O external input pad 51*oi* and the ground node Ng, and between the power supply node Nva connected to the I/O power supply pad 51*va* and the ground node Ng.

Figure 11:
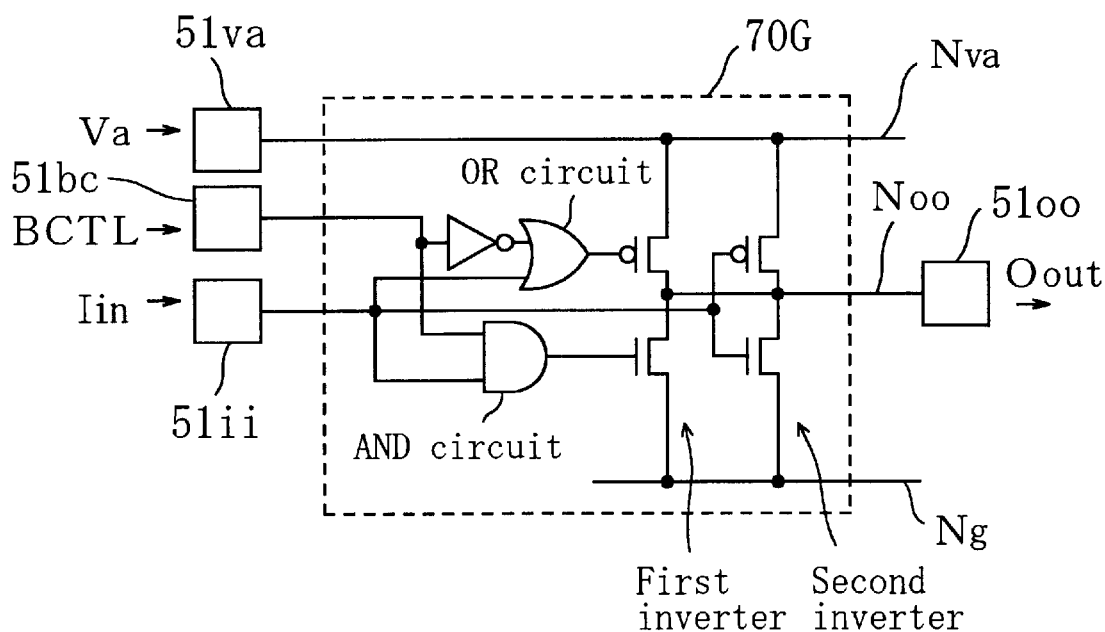
FIG. 11 is an electric circuit diagram illustrating a configuration of an I/O circuit section that functions as an output circuit having a driving power switching function.

FIG. 11 is an electric circuit diagram illustrating a configuration of an I/O circuit section 70G that functions as an output circuit having a driving power switching function. As illustrated in the figure, a control signal pad 51*bc* for receiving a control signal BCTL is provided outside the I/O circuit section 70G. Moreover, in the I/O circuit section 70G, first and second inverters are provided between the power supply node Nva and the ground node Ng. Furthermore, an OR circuit for supplying a control signal to the gate electrode of the PMOSFET of the first inverter and an AND circuit for supplying a control signal to the gate of the NMOSFET of the first inverter are provided. A signal obtained by an OR operation between the inverted signal of the control signal BCTL and the internal input signal Iin is input to the gate electrode of the PMOSFET of the first inverter, a signal obtained by an AND operation between the control signal BCTL and the internal input signal Iin is input to the gate electrode of the NMOSFET of the first inverter, and an internal input signal Iii is input to the PMOSFET and the NMOSFET of the second inverter.

When the control signal BCTL is at the logical value "H", the first inverter and the second inverter both output the inverted signal of the internal input signal Iin. On the other hand, when the control signal BCTL is at the logical value "L", the PMOSFET and the NMOSFET of the first inverter are always OFF whether the logical value of the internal input signal Iin is "H" or "L", whereby the output of the first inverter is in a Hi-Z (high impedance) state. The output of the second inverter is the inverted signal "H" of the internal input signal Iii. Therefore, the inverted signal of the internal input signal Iii, which is inverted by the second inverter, is output to an I/O external pad from the I/O external output pad 51oo via the output node Noo as an external output signal Ooo. Thus, when the control signal BCTL is at the logical value "H", the first inverter and the second inverter both operate, whereas when the control signal BCTL is at the logical value "L", only the second inverter operates. Therefore, it is possible to switch the driving power of the output circuit by switching the logical value of the control signal BCTL. Moreover, if the control signal BCTL is fixed at either level, the driving power of the output circuit is also fixed. In other words, the control signal pad 51bc functions as an I/O function changing terminal. The configuration as described above provides various effects such as the realization of an external I/F configuration that is suitable for the specifications of an external device connected to the I/O external pad (see FIG. 1), which is an external terminal.

Note that as in the example illustrated in FIG. 4, surge protection diodes are provided between the external output node Noo connected to the I/O external output pad 51oo and the ground node Ng, and between the power supply node Nva connected to the I/O power supply pad 51va and the ground node Ng.

Second Embodiment

Figure 12:
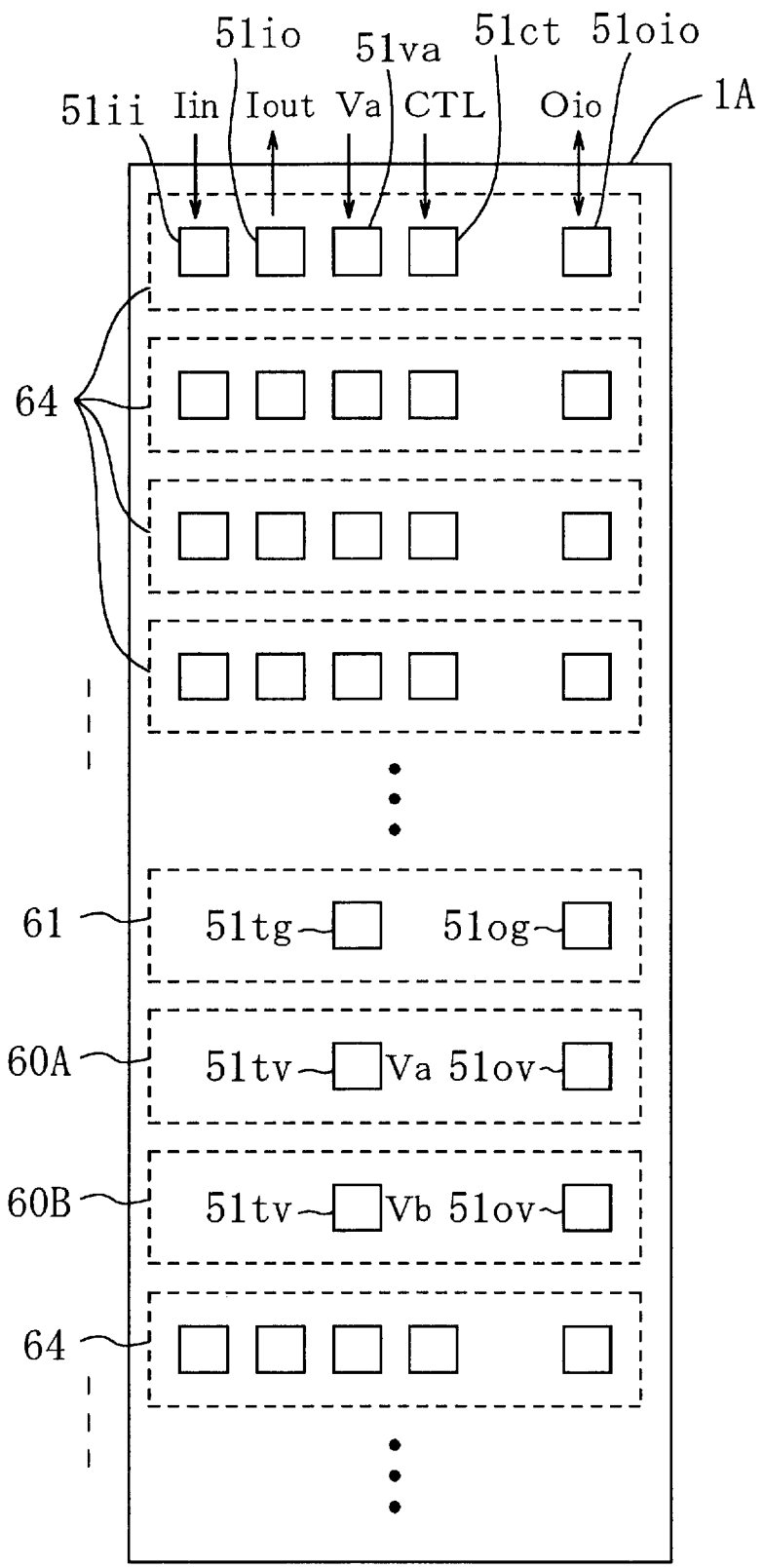
FIG. 12 is a block circuit diagram schematically illustrating a configuration of a dedicated I/O bare-chip IP according to the second embodiment.

FIG. 12 is a block circuit diagram schematically illustrating a configuration of a dedicated I/O bare-chip IP 1A of the second embodiment. In this example, the dedicated I/O bare-chip IP 1A has an I/O switching function. As illustrated in the figure, the dedicated I/O bare-chip IP 1A includes a large number of input/output buffer circuits 64, the ground input section 61, the first power supply input section 60A for supplying a first power supply voltage Vdd1, and the second power supply input section 60B for supplying a second power supply voltage Vdd2 (e.g., Vdd1>Vdd2). Note however that a greater number of power supply input sections, ground input sections and input/output buffer circuits, than illustrated in the figure, are provided in practice.

The input/output buffer circuit 64 includes an I/O circuit section having substantially the same configuration as that illustrated in FIG. 8. It includes the I/O internal input pad 51ii for receiving the internal input signal Iin, the I/O internal output pad 51io for outputting the internal output signal Iout, the I/O power supply pad 51va for supplying the power supply voltage Va, the control signal pad 51ct for receiving the control signal CTL, and the I/O external input/output pad 51oio for inputting/outputting the external input/output signal Ooio. Note that while only the uppermost one of the input/output buffer circuits 64 shown in FIG. 12 is provided with reference characters and signal designations, each pad in any other one of the input/output buffer circuits 64 that is at the same horizontal position in the figure inputs/outputs the same signal and has the same function.

Each of the power supply input sections 60A and 60B includes the chip power supply pad 51tv for supplying the power supply voltage to the bare-chip IP, and the external power supply input pad 51ov for receiving the supply of the power supply voltage from an external power supply. Moreover, the ground input section 61 includes the chip ground pad 51tg for supplying the ground power supply to the bare-chip IP, and the external ground input pad 51og for receiving the supply of the ground power supply from the outside. Each input/output buffer circuit 64 has a separate path for receiving the power supply voltage Va, so that the input/output buffer circuits 64 can receive different power supply voltages Va.

Note that although not shown in FIG. 12, the dedicated I/O bare-chip IP 1A is provided with surge protection diodes as those illustrated in FIG. 4. First, a surge protection diode is provided between the ground node connected to the ground line and the power supply node connected to the power supply line in each of the first and second power supply input sections 60A and 60B. Moreover, surge protection diodes are provided between the external input/output node connected to the I/O external input/output pad 51oio and the ground node, and between the power supply node connected to the I/O power supply pad 51va and the ground node, in the input/output buffer circuits 64. Thus, all the interfacing between bare-chip IPs in the IPOS device and external devices is provided through a dedicated I/O bare-chip IP, whereby the surge protection function in the IPOS device can be localized in the dedicated I/O bare-chip IP. Therefore, it is no longer necessary to provide a surge protection function separately for each bare-chip IP, whereby it is possible to reduce the cost of each bare-chip IP, to increase the speed of the chip-to-chip interface in the IPOS device, and to reduce the power consumption of the IPOS device.

The input/output buffer circuit 64 has an input/output switching function as illustrated in FIG. 8. Therefore, assuming that the first power supply voltage Vdd1 (corresponding to the power supply voltage Va in FIG. 8) is input to the input/output buffer circuit 64 as the power supply voltage Va, the input/output buffer circuit 64 acts as an input circuit that operates with the first power supply voltage Vdd1 when the control signal CTL is at the logical value "L", and acts as an output circuit that operates with the first power supply voltage Vdd1 when the control signal CTL is at the logical value "H". Moreover, assuming that the second power supply voltage Vdd2 (corresponding to the power supply voltage Vb in FIG. 8) is input to the input/output buffer circuit 64 as the power supply voltage Va, the input/output buffer circuit 64 acts as an input circuit that operates with the second power supply voltage Vdd2 when the control signal CTL is at the logical value "L", and acts as an output circuit that operates with the second power supply voltage Vdd2 when the control signal CTL is at the logical value "H".

With the dedicated I/O bare-chip IP of the present embodiment, respective power supplies of the input/output buffer circuits 64 are separated from one another, with each of the input/output buffer circuits being provided with a large number of I/O circuit sections each of which can be switched to be an input circuit or an output circuit by switching the control signal CTL, whereby it is possible to freely select the voltage amplitude of the output signal of each I/O circuit section or the input/output characteristics thereof.

Specific Example of Second Embodiment

Figure 13:
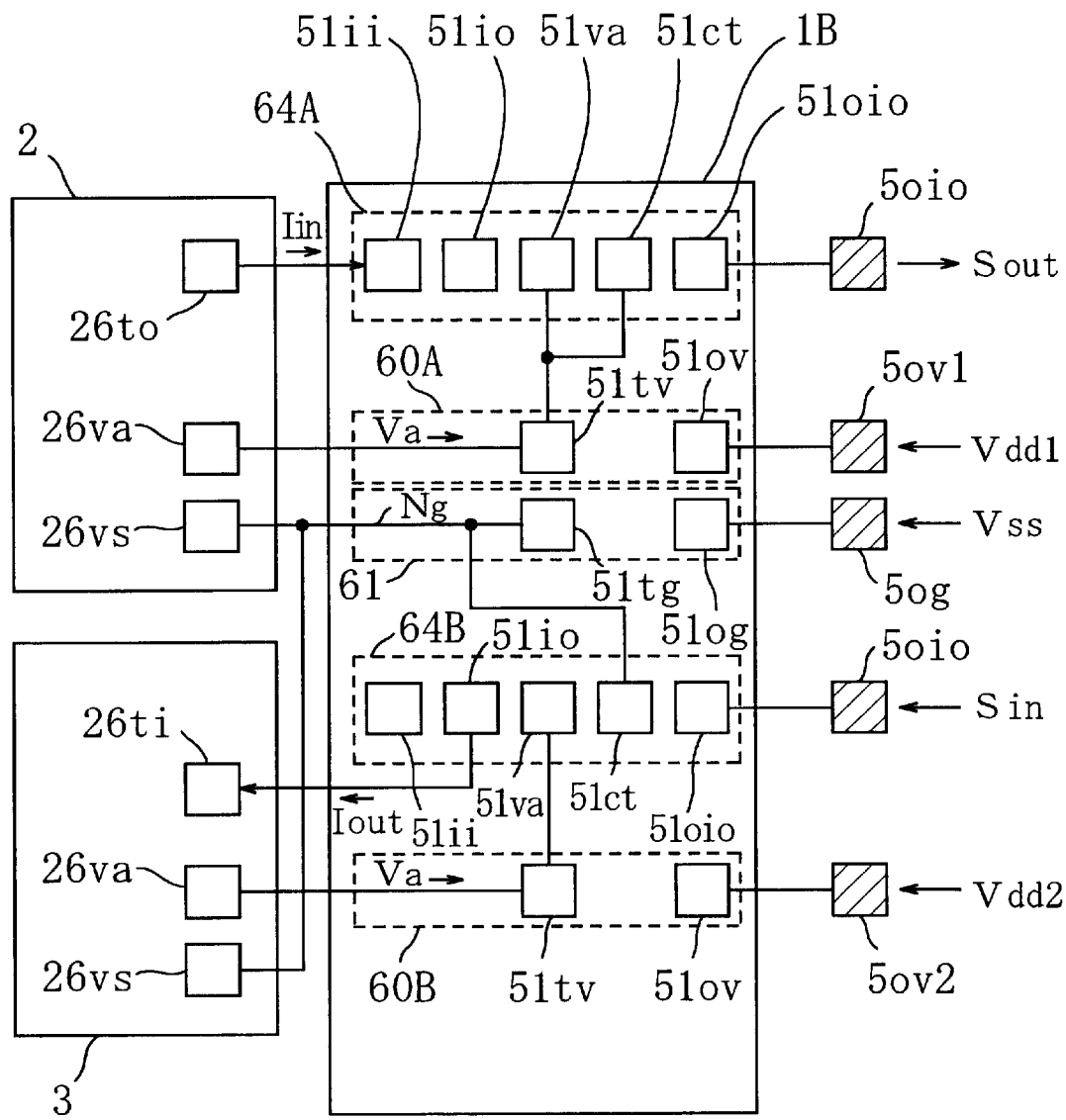
FIG. 13 is a block circuit diagram schematically illustrating a configuration of a dedicated I/O bare-chip IP, which is a specific example of the second embodiment, with other bare-chip IPs connected thereto.

FIG. 13 is a block circuit diagram schematically illustrating a configuration of a dedicated I/O bare-chip IP 1B, which is a specific example of the second embodiment, with other bare-chip IPs connected thereto. In this example, an I/O circuit section is used while being fixed to be an input circuit or an output circuit, by utilizing the I/O switching function of the dedicated I/O bare-chip IP 1A illustrated in FIG. 12. Members shown in FIG. 13 that are provided with the same reference characters as those of FIG. 12 are the same members as those of FIG. 12, and only those members that are particularly necessary in this specific example will be described below.

In this specific example, a case where the dedicated I/O bare-chip IP 1B functions as an I/O chip for the bare-chip IPs 2 and 3, as illustrated in the figure, will be described. It is assumed that the bare-chip IP 2 is provided with an output pad 26*to*, a power supply pad 26*va* and a ground supply pad 26*vs*. Moreover, it is assumed that the bare-chip IP 3 is provided with an input pad 26*ti*, a power supply pad 26*va* and a ground supply pad 26*vs*. Note however that there are a large number of output pads and input pads in the bare-chip IPs 2 and 3 so that signals can be exchanged between the bare-chip IPs 2 and 3 and the dedicated I/O bare-chip IP 1B, or between the bare-chip IPs 2 and 3 (see FIG. 1).

Moreover, I/O external pads that function as external terminals for connection to external devices (I/F electrodes for connection to the outside) include an I/O external pad 5*oio* for signal input/output for sending an output signal Sout to an external device or receiving an input signal Sin from an external device, an I/O external pad 5*ov*1 for supplying the first power supply voltage Vdd1, an I/O external pad 5*ov*2 for supplying the second power supply voltage Vdd2, and an I/O external pad 5*og* for supplying the ground potential Vss. Note however that the silicon wiring substrate 100 is provided with a large number of I/O pads for signal input/output, in addition to the I/O external pads illustrated in FIG. 13.

Note that the pads of the bare-chip IPs 2 and 3 and the pads of the dedicated I/O bare-chip IP 1B can be electrically connected to each other, by connecting the pads to each other via bumps as illustrated in FIG. 3, or by connecting wiring layers in the silicon wiring substrate, plugs and the pads together.

In an input/output buffer circuit 64A that functions as an I/O section between the bare-chip IP 2 and an I/O external pad, the control signal pad 51*ct* is connected to the chip power supply pad 51*tv* of the first power supply input section 60A through the wiring layers in the silicon wiring substrate 100, and the first power supply voltage Vdd1 is supplied to the control signal pad 51*ct*. Thus, the input/output buffer circuit 64A functions as an output circuit by always receiving the logical value "H" as the control signal CTL. Therefore, when the internal input signal Iin, which is input from the output pad 26*to* of the bare-chip IP 2 to the input/output buffer circuit 64A, is received, an external output signal is output from the I/O external input/output pad 51*oio* of the input/output buffer circuit 64A to the I/O external pad 5*oio*, and the output signal Sout is sent from the I/O external pad 5*oio* to the external device.

On the other hand, in an output buffer circuit 64B that functions as an I/O section between the bare-chip IP 3 and an I/O external pad, the control signal pad 51*ct* is connected to the ground node Ng, which is connected to the chip ground pad 51*tg* of the ground input section 61, through the wiring layers in the silicon wiring substrate 100, and the ground potential is supplied to the control signal pad 51*ct*. Thus, the output buffer circuit 64B functions as an input circuit by always receiving the logical value "L" as the control signal CTL. Therefore, the input signal Sin, which is sent from an external device to the output buffer circuit 64B via the I/O external pad 5*oio*, is sent from the I/O internal output pad 51*io* of the output buffer circuit 64B to the input pad 26*ti* of the bare-chip IP 3 as the internal output signal Iout.

Note that as illustrated in FIG. 13, the ground input section 61 is used commonly among the I/O sections.

Note that although not shown in FIG. 13, the bare-chip IPs 2 and 3 include, in addition to the output pads illustrated in FIG. 13, output pads and input pads for exchanging signals to/from the dedicated I/O bare-chip IP 1B. Input/output buffer circuits, which are connected to the output pads and the input pads in the bare-chip IPs 2 and 3, are provided in the dedicated I/O bare-chip IP 1B. Each input/output buffer circuit can be made to function as either an output circuit or an input circuit based on whether the control signal pad 51*ct* of the input/output buffer circuit is connected to the chip power supply pad 51*tv* of a power supply input section 60 or to the ground node Ng of the ground input section 61. Thus, the input/output buffer circuits 64 having the same configuration are provided as I/O sections, so that each input/output buffer circuit 64 can be selectively used as an output circuit for outputting signals to an I/O external pad or as an input circuit for receiving signals from an I/O external pad only by switching the connection thereof Therefore, it is possible to develop a small-variety large-lot production system by commonly using configuration of the dedicated I/O chip.

Third Embodiment

Figure 14:
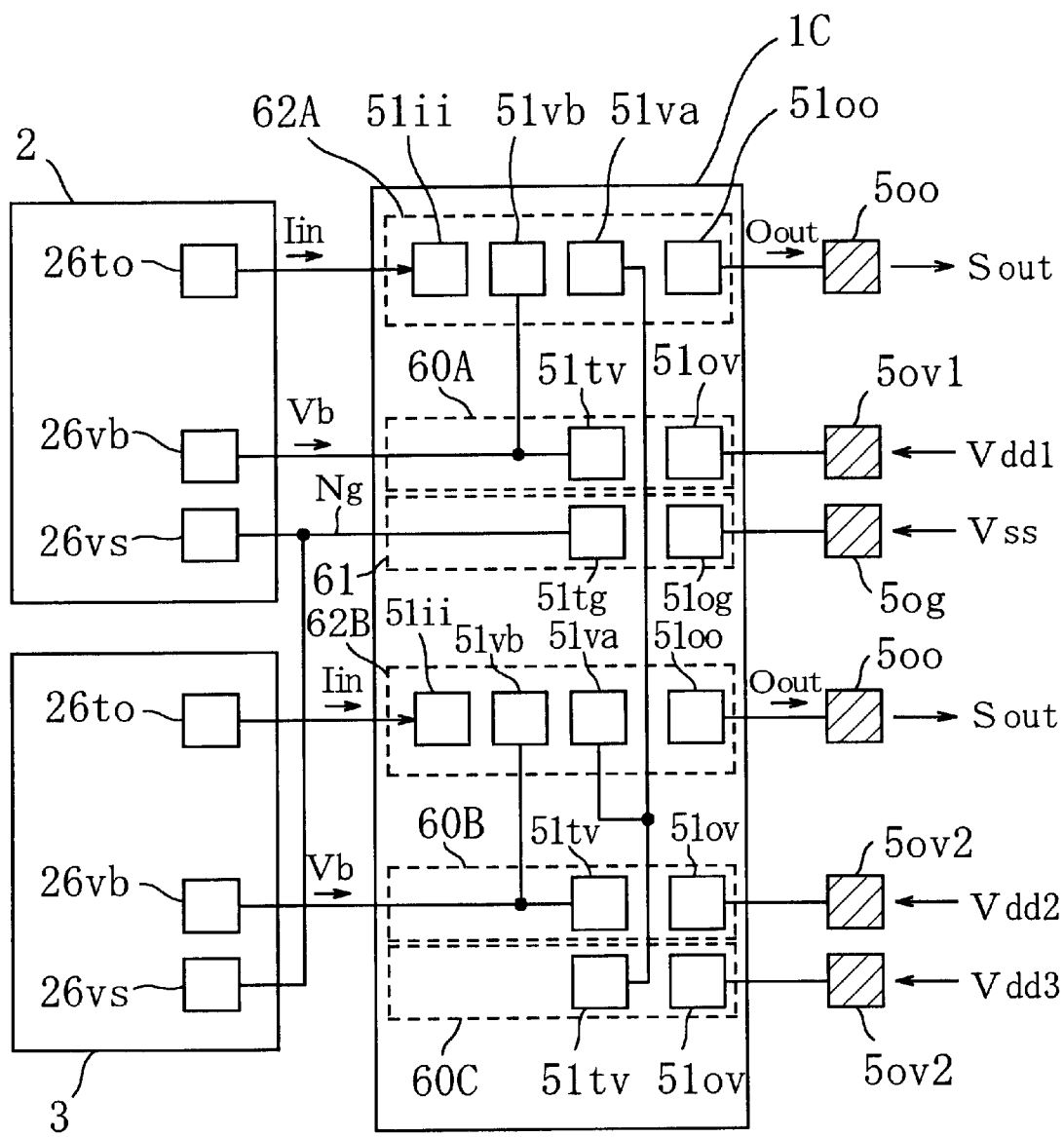
FIG. 14 is a block circuit diagram schematically illustrating a configuration of a dedicated I/O bare-chip IP of the third embodiment, with other bare-chip IPs connected thereto.

FIG. 14 is a block circuit diagram schematically illustrating a configuration of a dedicated I/O bare-chip IP 1C of the third embodiment, with other bare-chip IPs connected thereto. In this example, the voltage level of the output signal to the I/O external pad is adjusted by utilizing an output buffer circuit in which an output circuit with a level shift function is provided as illustrated in FIG. 9. Members shown in FIG. 14 that are provided with the same reference characters as those of FIG. 4 are the same members as those of FIG. 4, and only those members that are particularly necessary in this specific example will be described below.

In the present embodiment, a case where the dedicated I/O bare-chip IP 1C functions as an I/O chip for the bare-chip IPs 2 and 3, as illustrated in the figure, will be described. It is assumed that each of the bare-chip IPs 2 and 3 is provided with the output pad 26*to*, a power supply pad 26*vb*, and the ground supply pad 26*vs*. Note however that there are a large number of output pads and input pads in the bare-chip IPs 2 and 3 so that signals can be exchanged between the bare-chip IPs 2 and 3 and the dedicated I/O bare-chip IP 1C, or between the bare-chip IPs 2 and 3 (see FIG. 1).

Moreover, I/O external pads that function as external terminals for connection to external devices (I/F electrodes for connection to the outside) include an I/O external pad 5*oo* for signal output for sending the output signal Sout to an external device, the I/O external pad 5*ov*1 for supplying the first power supply voltage Vdd1 used in the bare-chip IP 2, the I/O external pad 5*ov*2 for supplying the second power supply voltage Vdd2 used in the bare-chip IP 3, an I/O external pad 5*ov*3 for supplying a third power supply voltage Vdd3 used for external I/F, and the I/O external pad 5*og* for supplying the ground potential Vss. Note however that the silicon wiring substrate 100 is provided with a large number of I/O pads for signal input/output, in addition to the I/O external pads illustrated in FIG. 14.

Note that the pads of the bare-chip IPs 2 and 3 and the pads of the dedicated I/O bare-chip IP 1B can be electrically connected to each other, by connecting the pads to each other via bumps as illustrated in FIG. 3, or by connecting wiring layers in the silicon wiring substrate, plugs and the pads together.

Moreover, the dedicated I/O bare-chip IP IC is provided with two output buffer circuits 62A and 62B as I/O sections. Each of the output buffer circuits 62A and 62B is provided with the I/O internal input pad 51*ii* for receiving the internal input signal Iin, the I/O power supply pad 51*vb* for supplying the power supply voltage Vb, the I/O power supply pad 51*va* for receiving the power supply voltage Va, and the I/O external output pad 51*oo* for sending out the external output signal Oout.

In the output buffer circuit 62A that functions as an I/O section between the bare-chip IP 2 and an I/O external pad, the power supply pad 51va is connected to the chip power supply pad 51tv of a third power supply input section 60C, and the third power supply voltage Vdd3 is supplied to the power supply pad 51va. Thus, the output buffer circuit 62A is configured so as to output, through the same function as the I/O circuit section 70E illustrated in FIG. 9, the non-inverted signal of the internal input signal Iin, which is input from the I/O internal input pad 51ii, from the I/O external pad 5oo to the I/O external pad as the output signal Sout, which is obtained by converting the voltage level from Vb (Vdd1) to Va (=Vdd3).

Moreover, also in the output buffer circuit 62B that functions as an I/O section between the bare-chip IP 3 and an I/O external pad, the power supply pad 51va is connected to the chip power supply pad 51tv of the third power supply input section 60C, and the third power supply voltage Vdd3 is supplied to the power supply pad 51va. Thus, the output buffer circuit 62B is configured so as to output, through the same function as the I/O circuit section 70E illustrated in FIG. 9, the non-inverted signal of the internal input signal Iin, which is input from the I/O internal input pad 51ii, from the I/O external pad 5oo to an external device as the output signal Sout, which is obtained by converting the voltage level from Vb (Vdd2) to Va (=Vdd3).

According to the present embodiment, even when the voltage level of the external I/F is higher than the power supply voltage Vb of the bare-chip IP, the output signal can be sent out at the voltage level of the external I/F from the I/O external pad 5oo, which functions as an external terminal, to an external device.

Note that also in the present embodiment, the ground input section 61 is used commonly among the I/O sections as illustrated in FIG. 13.

Note that although not shown in FIG. 14, the bare-chip IPs 2 and 3 may include, in addition to the output pads illustrated in FIG. 14, output pads and input pads for exchanging signals to/from the dedicated I/O bare-chip IP 1C, and input/output buffer circuits, which are connected to the output pads and the input pads in the bare-chip IPs 2 and 3 as illustrated in FIG. 13, may be provided in the dedicated I/O bare-chip IP 1C. Moreover, an input buffer circuit that functions as an input circuit with a level shift circuit, as illustrated in FIG. 10, may be provided.

Note that the embodiments have been described with respect to a case where the pads of the bare-chip IPs 2 and 3 and the pads of the dedicated I/O bare-chip IP 1 are connected to each other via wiring layers, plugs, etc., in the silicon wiring substrate 100. However, the pads of the bare-chip IPs 2 and 3 and the pads of the dedicated I/O bare-chip IP 1 may alternatively be connected to each other via a bonding wire (thin metal line) or a ribbon. This is because also in such a case, the surge protection function, the input/output switching function of an I/O circuit section, the function of changing the power supply voltage by a level shift circuit, etc., can be realized as in the embodiments above.

What is claimed is:

1. An I/O semiconductor chip provided in a multi-chip module, said multi-chip module includes a plurality of semiconductor chips and a plurality of external terminals, the I/O semiconductor chip comprising an input/output function section including a plurality of input/output circuits that are provided between the plurality of external terminals and the plurality of semiconductor chips, said plurality of semiconductor chips having no direct connection to the plurality of external terminals.

2. The semiconductor chip of claim 1, wherein:

the plurality of external terminals include a power supply terminal and a ground terminal; and the input/output function section includes a power supply section connected to the power supply terminal for supplying a power supply voltage to the plurality of semiconductor chips, and a ground voltage supply section connected to the power supply terminal for supplying a ground voltage to the plurality of semiconductor chips.

3. The semiconductor chip of claim 1, further comprising a surge protection member provided between the ground terminal among the plurality of external terminals and one or more of the plurality of external terminals excluding the ground terminal.

4. The semiconductor chip of claim 1, wherein the plurality of input/output circuits of the input/output function section are configured so as to be able to individually select a power supply voltage.

5. The semiconductor chip of claim 1, wherein at least one of the plurality of input/output circuits of the input/output function section is configured so as to be switchable between an input function of receiving a signal from the semiconductor chip that is connected to the input/output circuit and an output function of outputting a signal to the external terminal to which the input/output circuit is connected.

6. The semiconductor chip of claim 1, wherein the input/output circuits receive a plurality of power supply voltages and include a level shift circuit for converting a voltage level from a level of a first voltage among the plurality of power supply voltages to a level of a second voltage.

7. The semiconductor chip of claim 6, wherein the first voltage and the second voltage are configured so that a voltage value can be selected for each of the input/output circuits in the input/output function section.

8. A multi-chip module comprising a plurality of semiconductor chips and a plurality of external terminals, the multi-chip module comprising an I/O semiconductor chip that includes an input/output function section including a plurality of input/output circuits provided between the plurality of semiconductor chips and the plurality of external terminals, said plurality of semiconductor chips having no direct connection to the plurality of external terminals.

9. A multi-chip module comprising a group of small chips mounted on a large chip that includes a plurality of external terminals, the multi-chip module comprising an I/O semiconductor chip that includes an input/output function section including a plurality of input/output circuits provided between the plurality of external terminals on the large chip and individual ones of the group of small chips, said group of small chips having no direct connection to the plurality of external terminals.

10. The multi-chip module of claim 9, wherein the large chip is a substrate dedicated for wiring that does not include a semiconductor element.

* * * * *